United States Patent
Chen et al.

(10) Patent No.: US 11,307,258 B2
(45) Date of Patent: Apr. 19, 2022

(54) METHOD AND SYSTEM FOR ESTIMATING OPEN CIRCUIT VOLTAGE OF LI-ION BATTERIES WITH TEMPERATURE INPUT

(71) Applicant: JIANGSU UNIVERSITY, Jiangsu (CN)

(72) Inventors: Biao Chen, Jiangsu (CN); Haobin Jiang, Jiangsu (CN); Huayang Sun, Jiangsu (CN); Huanhuan Li, Jiangsu (CN); Lei Hua, Jiangsu (CN)

(73) Assignee: JIANGSU UNIVERSITY, Jiangsu (CN)

( * ) Notice: Subject to any disclaimer, the term of this patent is extended or adjusted under 35 U.S.C. 154(b) by 0 days.

(21) Appl. No.: 16/960,497

(22) PCT Filed: Apr. 30, 2019

(86) PCT No.: PCT/CN2019/085079
§ 371 (c)(1),
(2) Date: Jul. 7, 2020

(87) PCT Pub. No.: WO2020/172989
PCT Pub. Date: Sep. 3, 2020

(65) Prior Publication Data
US 2021/0141019 A1 May 13, 2021

(30) Foreign Application Priority Data
Feb. 25, 2019 (CN) .......... 201910137591.X (51) Int. Cl.
*G01R 31/367* (2019.01)
*G01R 31/374* (2019.01)

(52) U.S. Cl.
CPC ......... *G01R 31/367* (2019.01); *G01R 31/374* (2019.01)

(58) Field of Classification Search
None
See application file for complete search history.

(56) References Cited

U.S. PATENT DOCUMENTS

| | | | |
|---|---|---|---|
| 2012/0143585 A1* | 6/2012 | Barsukov | G01R 31/367 703/18 |
| 2014/0210418 A1 | 7/2014 | Wang et al. | |
| 2020/0158783 A1 | 5/2020 | Chen et al. | |

FOREIGN PATENT DOCUMENTS

| | | |
|---|---|---|
| CN | 1832246 A | 9/2006 |
| CN | 103439668 A | 12/2013 |
| CN | 108169682 A | 6/2018 |

OTHER PUBLICATIONS

Nejad et al., "A systematic review of lumped-parameter equivalent circuit models for real-time estimation of lithium-ion battery states" Journal of Power Sources 316 (2016) (Year: 2016).*

(Continued)

*Primary Examiner* — John C Kuan
(74) *Attorney, Agent, or Firm* — Notaro, Michalos & Zaccaria P.C.

(57) ABSTRACT

A method and system for estimating open circuit voltage of lithium ion batteries with temperature input, that has the following steps: step 1 the undetermined equation for estimating open circuit voltage with temperature input is derived according to the gas-liquid dynamic model; step 2: the estimation equation parameters are identified according to the experimental data and put into the undetermined equation for estimating open circuit voltage in the step 1 to obtain a complete equation for estimating open circuit voltage; step 3: the method for estimating open circuit voltage with temperature input is designed according to the complete equation for estimating open circuit voltage.

8 Claims, 5 Drawing Sheets

(56) References Cited

OTHER PUBLICATIONS

Li et al., "A Practical Lithium-Ion Battery Model for State of Energy and Voltage Responses Prediction Incorporating Temperature and Ageing Effects" IEEE Transactions on Industrial Electronics, vol. 65, No. 8, Aug. 2018 (Year: 2018).*
Wang et al., "On-line battery state-of-charge estimation based on an integrated estimator" Applied Energy 185 (2017) 2026-2032 (Year: 2017).*
Jiang, Haobin et al., State-of-charge estimation of lithium-ion batteries from a gas-liquid dynamics model including the direct temperature input, Journal of Energy Storage 39 (2021)102622, Elsevier, Journal Homepage: www.elsevier.com/locate/est.

* cited by examiner

METHOD AND SYSTEM FOR ESTIMATING OPEN CIRCUIT VOLTAGE OF LI-ION BATTERIES WITH TEMPERATURE INPUT

TECHNICAL FIELD

This patent relates to the field of battery management systems and specifically, it is a method and system for estimating open circuit voltage of Li-ion batteries with temperature input.

BACKGROUND ART

According to the latest estimates of the American Petroleum Industry Association, the unexploited crude oil reserves on the earth are less than two trillion barrels, and the time for human exploitation is no more than ninety-five years. Automobiles account for more than one-third of total oil consumption. Countries around the world have made a lot of efforts to realize the transformation of automobile energy. Among them, one of feasible methods is the electrification of fuel vehicles. However, the on-board lithium battery has a large charging and discharging window, the battery charging and discharging process reveals extremely complicated nonlinear characteristics, and the available capacity of the battery is greatly affected by changes in the ambient temperature. At present, the battery models are generally complex, and the state equation does not reflect the influence of temperature on the battery characteristics. It is necessary to introduce temperature compensation coefficients or empirical formulas to correct the estimation algorithm, which will increase the difficulty of parameter identification and the time of calculation, and decrease model robustness. These problems eventually lead to inaccurate estimation of the open circuit voltage of the battery and difficulty of determining the remaining cruising range. Therefore, it is important to establish a model of estimating open circuit voltage with temperature input.

Currently, electrochemical models and equivalent circuit models are the most studied battery analysis models. The electrochemical model can directly estimate the SOC of the battery through the lithium ion concentration on the surface of the positive electrode material, and the estimation accuracy is high, but the equations of state, differential equations and partial differential equations are very complicated, which results in that dozens of parameters need to be identified. The final estimation algorithm still needs to be coupled with temperature, which leads to the complexity of the model and a huge amount of calculation. Therefore, it is difficult to be used for real-time estimation based on vehicle MCU. Compared with electrochemical models, equivalent circuit models study the charging and discharging process from the perspective of the external characteristics of the battery, which is simple, intuitive and has clear physical meaning. Researchers have intensively researched and developed various forms and structures, such as Rint model, Thevenin model, PNGV, n-RC model and so on. The equivalent circuit model itself has limited estimation accuracy in the entire battery charging and discharging process, so it is usually combined with intelligent algorithms to form a closed-loop estimation system, such as Sliding-mode algorithm, fuzzy logic algorithm, simulated annealing algorithm, particle filter algorithm, Kalman filter and its extensions (unscented Kalman, extended Kalman, finite difference Kalman, etc.). Intelligent algorithms need a huge amount of calculations, and finally the equivalent circuit models still need to be coupled with temperature, so it is also difficult to realize real-time estimation based on the vehicle MCU.

In summary, relying on the existing battery models is far from meeting the needs of practical applications, so there is an urgent need for a battery model which can more accurately reflect the relationship between temperature and battery performance, more accurately reveal the nonlinear characteristic during the battery charging and discharging process, and only requires simple analysis and computation.

Contents of the Invention

In order to solve above problems, this patent provides a method and a system for estimating the open circuit voltage of Li-ion batteries with temperature input, which has a battery model state equation to reflect the influence of temperature on the performance of the battery, without introducing a temperature correction coefficient or an empirical formula. The model of this method is simple and intuitive to understand. Additionally, this model's parameters are easy to identify so that it can easily be applied into practice.

The technical solution adopted by the present invention to solve the technical problem is as follows: A method for estimating open circuit voltage of Li-ion batteries with temperature input includes the following steps:

Step 1: deriving an undetermined equation for estimating open circuit voltage with temperature input according to the gas-liquid dynamic model:

$$P_3 = \frac{(P_2 - T_2 k_2)(T_1 k_2 + P_1) - T_1 k_1 + \sqrt{\begin{array}{c}(T_1 k_2 + P_1)^2 (T_2 k_2 + P_2)^2 + T_1^2 k_1^2 + \\ 2 k_1 (T_1 k_2 + P_1)(T_1 T_2 k_2 + 2 T_2 P_1 - T_1 P_2)\end{array}}}{2(T_1 k_2 + P_1)} \text{ wherein,}$$

$$P_2 = P_0 - \frac{1}{2}\rho I |I| - \frac{1}{2}\mu \rho I$$

$P_0$, $I$ and $P_1$ represent the orifice pressure, the gas flow rate and the pressure inside the container under steady state in the gas-liquid dynamic model, respectively, and correspond to the terminal voltage, the current and the open circuit voltage in the battery respectively; $P_3$ represents the gas pressure in the container under steady state to be estimated in the gas-liquid dynamic model, and represents the open circuit voltage to be estimated in the battery; $T_1$ represents the steady-state gas temperature in the container at the previous moment in the gas-liquid dynamic model, and represents the steady-state battery temperature at the previous moment in the battery; $T_2$ represents the temperature of the gas in the container during the exhausting or inflating process in the gas-liquid dynamic model, and represents the battery temperature during discharging or charging process in the battery; $\mu$ represents the density of gas flow, $\mu$ represents resistance coefficient of gas flow, $k_1$ represents the first equivalent parameter, $k_2$ represents the second equivalent parameter, and $P_0$ represents the orifice pressure.

Step 2: identifying and estimating the equation parameters according to the experimental data: the open circuit voltages corresponding to different currents, terminal voltages and temperatures are obtained through the experimental test, the optimal value of the parameters $k_1$, $k_2$, $\rho$ and $\mu$ in the equation for estimating open circuit voltage are identified by identification methods, and then the values of the parameters $k_1$, $k_2$, $\lambda$ and $\mu$ are assigned to the undetermined equation for estimating the open circuit voltage in the step 1 to obtain a complete equation for estimating open circuit voltage.

Step 3: designing a method for estimating open circuit voltage with temperature input according to the complete equation for estimating open circuit voltage and calculating to obtain the estimated value of open circuit voltage.

In the above solution, the physical prototype of the gas-liquid dynamic model is a closed container with a gas-liquid coexistence system, and pipes and valves are installed at the top of the container. There is a certain volume ($V_w$) of liquid in the container and the remaining volume (V) is filled with the gas with the pressure of P, temperature of T, amount of substance of n and density of ρ.

In the above solution, the specific process of the step one is as follows:

In the above gas-liquid dynamic model, $\mu$ is comprehensive resistance coefficient of the pipe during gas flow; I and $P_0$ are gas flow rate and orifice gas pressure respectively; P, V, n and T are pressure, volume, the amount of substance and thermodynamic temperature of the gas in the container respectively; $V_w$ and $n_j$ are the volume of the liquid and the amount of substance of the gas dissolved in the liquid in the equilibrium state; $P_1$ is the steady-state gas pressure in the container at the previous moment; $P_2$ is the gas pressure in the container during exhausting or inflating process; $P_3$ is the steady-state gas pressure in the container to be estimated; with regard to the gas-liquid dynamic model, the valve is opened at time $t_1$ to exhaust or inflate with the gas, the valve is closed at time $t_2$, $t_2 = t_1 + \Delta t$, $\Delta t \to 0$, and an equilibrium state is reached at time $t_3$;

At time $t_1^-$,
the ideal gas state equation is $$P_1 V = n_1 R T_1 \quad \text{Equation (1)}$$

Solubility equation for gas gap filling is:

$$n_{j1} = \frac{P_1 \phi_m V_w}{R T_1 + b_m P_1} \quad \text{Equation (2)}$$

Wherein, $T_1$: steady-state gas temperature in the container, $P_1$: gas pressure; $n_1$: amount of substance of gas; V: gas volume; R: thermodynamic constant; $\Phi_m$: effective gap constant; $b_m$: Van der waals volume of gas molecules; $V_w$: liquid volume; $n_{j1}$: amount of substance of gas dissolved in the liquid; $t_1^-$: left limit of time $t_1$.

At time $t_2^-$,
the ideal gas state equation is $$P_2 V = n_2 R T_2 \quad \text{Equation (3)}$$

Wherein. $T_2$: gas temperature in the container during the exhausting or inflating process; $P_2$: gas pressure; $n_2$: amount of substance of gas; $t_2^-$: left limit of time $t_2$.

At time $t_3$,
the ideal gas state equation is $$P_3 V = n_3 R T_2 \quad \text{Equation (4)}$$

$$n_{j3} = \frac{P_3 \phi_m V_w}{R T_2 + b_m P_3} \quad \text{Equation (6)}$$

$$n_3 = n_2 + n_{j1} - n_{j3} \quad \text{Equation (5)}$$

Solubility equation for gas gap filling is:

wherein, $P_3$: gas pressure in the container under steady state to be estimated; $n_3$: amount of substance of gas; $n_{j3}$: amount of substance of gas dissolved in the liquid.

$P_s$ is assumed to be the pressure change from unsteady state to steady state of gas in the system from time $t_2$ to time $t_3$.

$$P_s = P_3 - P_2 \quad \text{Equation (7)}$$

Equations 1-6 are combined into Equation 7 to obtain the simplified Equation.

$$P_s = \quad \text{Equation (8)}$$

$$P_3 - P_2 = \frac{R^2 T_2 \phi_m V_w}{V b_m^2} \times \left( \frac{T_2}{\frac{RT_2}{b_m} + P_3} - \frac{T_1}{\frac{RT_1}{b_m} + P_1} \right)$$

Assuming:

$$k_1 = \frac{R^2 \phi_m V_w}{V b_m^2}, \quad k_2 = \frac{R}{b_m} \quad \text{Equation (9)}$$

Parameters $k_1$, $k_2$ are put back into Equation 8 again:

$$P_3 - P_2 = \frac{k_1 T_2}{k_2 T_2 + P_3} - \frac{k_1 T_1}{k_2 T_1 + P_1} \quad \text{Equation (10)}$$

All the parameters of Equation 10 have physical meaning, i.e. the values of all parameters are greater than 0 and the system pressure of the gas-liquid dynamic model is greater than 0, then the denominator is greater than 0, and Equation 10 is rewritten as Equation 11:

$$P_3^2 + P_3 \times \left( T_2 k_2 - P_2 + \frac{T_1 k_1}{T_1 k_2 + P_1} \right) + \quad \text{Equation (11)}$$
$$\left( \frac{T_1 k_1 T_2 k_2}{T_1 k_2 + P_1} - P_2 T_2 k_2 - k_1 T_2 \right) = 0$$

Considering $P_3$ as a variable, Equation 11 can be seen as a quadratic equation of $P_3$. Assuming:

$$a = 1, \; b = T_2 k_2 - P_2 + \frac{T_1 k_1}{T_1 k_2 + P_1}, \quad \text{Equation (12)}$$

$$c = \frac{T_1 k_1 T_2 k_2}{T_1 k_2 + P_1} - P_2 T_2 k_2 - T_2 k_1 \text{ as}$$

$$ac = -\frac{P_1 \times (P_2 k_2 + k_1) + P_2 k_2^2}{k_2 + P_1} < 0 \text{ is always true,}$$

$$\Delta = b^2 - 4ac > 0 \text{ is true, thus Equation 11}$$

has and only has one real root, which is.

$$P_3 = \frac{(P_2 - T_2 k_2)(T_1 k_2 + P_1) - T_1 k_1 + \sqrt{\begin{array}{c}(T_1 k_2 + P_1)^2 (T_2 k_2 + P_2)^2 + T_1^2 k_1^2 + \\ 2 k_1 (T_1 k_2 + P_1)(T_1 T_2 k_2 + 2 T_2 P_1 - T_1 P_2)\end{array}}}{2(T_1 k_2 + P_1)} \quad \text{Equation (13)}$$

When the system of gas-liquid dynamic model is at a time between $t_1$ and $t_2$, it can be listed according to the continuity equation of gas flow:

$$P_2 = P_0 - 1/2\rho I|I| - 1/2\mu\rho I \qquad \text{Equation (14)}$$

In the above solution, the specific process of identifying the estimated equation parameter in the step two is as follows:

1. Reading the data of open circuit voltage OCV, terminal voltage U, current I, and temperature T.
2. Assigning initial values to $P_1$ and $T_1$ in equation for estimating open circuit voltage OCV: $P_1=OCV(1)$, $T_1=T(1)$, k=1.
3. Assigning: $P_0=U(k)$, $I=I(k)$, $T_2=T(k)$.
4. Assuming the parameters to be identified $k_1$, $k_2$, $\rho$ and $\mu$ to be greater than or equal to 0.
5. Putting into the equation for estimating open circuit voltage OCV.
6. Updating the initial values of $P_1$, $T_1$ and k: $P_1=P_3$, $T_1=T_2$, k=k+1.
7. Using an estimation total error $S=S+|P_3-OCV(k)|$ as the objective function.
8. Using genetic algorithm to solve an optimal method to determine the termination condition.
9. Repeating the above steps 3 to 8 until the end of parameter identification, and outputting the optimal values of parameters $k_1$, $k_2$, $\rho$ and $\mu$.

In the above solution, the specific process of step three is as follows:

1. In the OCV estimation equation, assigning $P_1$ with the initial value $U(1)$ and $T_1$ with the initial value $T(1)$, i.e. $P_1=U(1)$, $T_1=T(1)$;
2. Assigning the parameter values identified by the genetic algorithm in step 2 to $k_1$, $k_2$, $\rho$ and $\mu$.
3. Assigning the collected data of terminal voltage, current and temperature to $P_0$, I and $T_2$.
4. Putting into the equation for estimating open circuit voltage, i.e. Equations 13 and 14, to calculate the current open circuit voltage $P_3$.
5. Using the calculated current open circuit voltage $P_3$ to update $P_1$ and using $T_2$ to update $T_1$, i.e. $P_1=P_3$, $T_1=T_2$;
6. Repeating the above steps 3 to 5 until the estimation of open circuit voltage is finished.

In the above solution, the identification method includes genetic algorithm, particle swarm algorithm, simulated annealing algorithm, ant colony algorithm, support vector machine, neural network algorithm or least square method.

Further, the identification method is genetic algorithm.

A system for realizing the estimation of open circuit voltage of Li-ion batteries with temperature input, comprises a signal acquisition module, an open circuit voltage estimation module and a display module;

The signal acquisition module is configured to collect current, temperature and voltage of the battery;

The signal acquisition module is connected to the open circuit voltage estimation module transmits the collected current, temperature and voltage signals to the open circuit voltage estimation module, and then the open circuit voltage estimation module calculates the open circuit voltage value according to the open circuit voltage estimation equation.

The open circuit voltage estimation module is connected to the display module, and sends the values of battery current, temperature, terminal voltage and open circuit voltage to the display module for display.

In the above solution, the signal acquisition module includes a current sensor, a temperature sensor, and a voltage sensor.

In the above solution, the open circuit voltage estimation module comprises a single chip microcomputer.

Compared with the present technologies, the benefits of the present invention are as follows:

1. The gas-liquid dynamic model state equation of the present invention includes the influence of temperature on the open circuit voltage of the battery, and does not need to introduce a temperature compensation coefficient or an empirical formula;
2. The amount of experimental data required for parameter identification of the invention is small, and the model parameters are easily identified;
3. In this invention, the sampling temperature at the previous time and the current time is input, and more temperature information is reflected in the process of estimating the open circuit voltage of the battery;
4. The equation for estimating the open circuit voltage of the present invention can eliminate the sampling error by itself iteration, and does not depend on the initial values. The accuracy of estimation is high.

DESCRIPTION OF DRAWINGS

This above and/or additional aspects and advantages of the present invention will become clear and easy to understood from the following figures.

EMBODIMENTS

The implementation of the present invention is described in detail below, and the examples of implementation are illustrated in the attached figures, wherein the same or similar reference numerals are used to refer to the same or similar elements or elements which have the same or similar functions. The implementation example described below with reference to the attached figures is intended to be illustrative of the invention and is not to be construed as the limitation of this invention.

In the description of this invention, it is to be understood that the terms "center", "longitudinal", "transverse", "length", "width", "thickness", "upper", "lower", "axial", "radial", "vertical", "horizontal", "inside" and "outside", which indicate the orientation or positional relationship, are based on the orientation or positional relationship shown in the attached figures. Rather than indicating or implying that the device or component must have a particular orientation, the construction and operation in a particular orientation, these terms are used for the convenience of describing the present invention and simplifying the description and are not to be construed as the limitation of this invention. Moreover, the terms "first" and "second" are used for descriptive purposes only and are not to be understood as indicating or implying a relative importance or implicitly indicating the number of technical features. Therefore, features defining "first" or "second" may include one or more of the features, either explicitly or implicitly. In the description of this invention, the meaning of "a plurality" is two or more unless it is specifically defined.

In this invention, the terms "installation", "connected", "fixed", etc., should be understood broadly unless they are specifically defined or limited. For example, 'connected' may be a fixed connection, a detachable connection, an integral connection, a mechanical connection, an electrical connection, directly connected, indirectly connected through an intermediate medium, or may be internal to both components. For those skilled in the related industry, the specific meanings of the above terms in this invention can be understood on a case-by-case basis.

Figure 1:
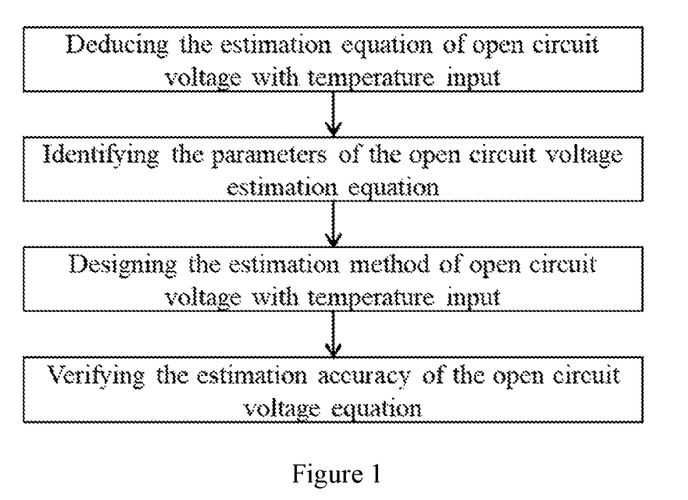
FIG. 1: Flow chart of the invention.

FIG. 1 shows an embodiment of a method for estimating open circuit voltage of a lithium ion battery with temperature input according to the present invention. The method for estimating open circuit voltage of a lithium ion battery with temperature input includes the following steps:

A variable-rate, variable-temperature and constant-current HPPC experiment is performed on a lithium-ion battery, and the data of the open circuit voltage, temperature, current and terminal voltage of the battery is recorded to identify the OCV equation parameters with temperature input; A variable-temperature working-condition HPPC experiment is performed on a lithium-ion battery, and the data of the open circuit voltage, temperature, current and terminal voltage of the battery is recorded to verify the effectiveness of the method for estimating open circuit voltage with temperature input.

Step 1: deriving an undetermined equation for estimating open circuit voltage with temperature input according to the gas-liquid dynamic model.

According to the ideal gas state equation, the gas dissolution equilibrium equation and the Bernoulli equation, the undetermined equation for estimating the open circuit voltage is derived as follows:

$$P_3 = \frac{(P_2 - T_2 k_2)(T_1 k_2 + P_1) - T_1 k_1 + \sqrt{\begin{array}{c}(T_1 k_2 + P_1)^2 (T_2 k_2 + P_2)^2 + T_1^2 k_1^2 + \\ 2k_1(T_1 k_2 + P_1)(T_1 T_2 k_2 + 2T_2 P_1 - T_1 P_2)\end{array}}}{2(T_1 k_2 + P_1)} \quad \text{Equation (14)}$$

wherein, $$P_2 = P_0 - \frac{1}{2}\rho I|I| - \frac{1}{2}\mu\rho I$$

$P_0$, I and $P_1$ represent the orifice pressure, the gas flow rate and the pressure inside the container under steady state in the gas-liquid dynamic model, respectively, and correspond to the terminal voltage, the current and the open circuit voltage in the battery respectively; $P_3$ represents the gas pressure in the container under steady state to be estimated in the gas-liquid dynamic model, and represents the open circuit voltage to be estimated in the battery; $T_1$ represents the steady-state gas temperature in the container at the previous moment in the gas-liquid dynamic model, and represents the steady-state battery temperature at the previous moment in the battery; $T_2$ represents the temperature of the gas in the container during the exhausting or inflating process in the gas-liquid dynamic model, and represents the battery temperature during discharging or charging process in the battery; $\mu$ represents the density of gas flow, $\mu$ represents resistance coefficient of gas flow, $k_1$ represents the first equivalent parameter, $k_2$ represents the second equivalent parameter, and $P_0$ represents the orifice pressure.

Step 2: identifying and estimating the equation parameters according to the experimental data: the open circuit voltages corresponding to different currents, terminal voltages and temperatures are obtained through the experimental test, the optimal value of the parameters $k_1$, $k_2$, $\rho$ and $\mu$ in the equation for estimating open circuit voltage are identified by identification methods, and then the values of the parameters $k_1$, $k_2$, $\lambda$ and $\mu$ are assigned to the undetermined equation for estimating the open circuit voltage in the step 1 to obtain a complete equation for estimating open circuit voltage.

Step 3: designing a method for estimating open circuit voltage with temperature input according to the complete equation for estimating open circuit voltage and calculating to obtain the estimated value of open circuit voltage.

Figure 2:
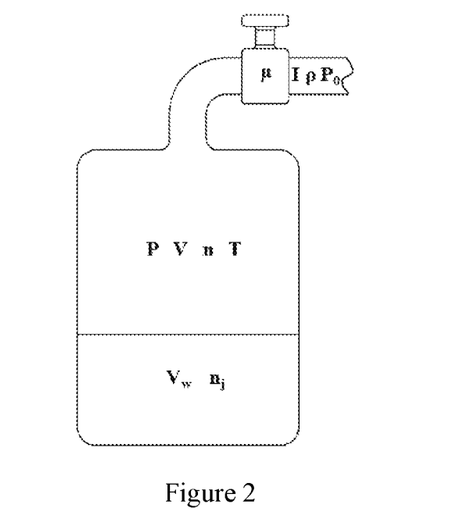
FIG. 2: The gas-liquid dynamics physical model figure of this invention.

As shown in FIG. 2, the physical prototype of the gas-liquid dynamic model in the step 1 is a sealed container provided with a gas-liquid coexistence system, and pipes and valves are installed at the top of the container. There is a certain volume ($V_w$) of liquid in the container and the remaining volume (V) is filled with the gas with the pressure of P, temperature of T, amount of substance of n and density of $\rho$.

Deriving an equation for estimating open circuit voltage with temperature input according to the gas-liquid dynamic model in the step 1 comprises the following specific process:

In the above gas-liquid dynamic model, $\mu$ is comprehensive resistance coefficient of the pipe during gas flow; I and $P_0$ are gas flow rate and orifice gas pressure respectively; P, V, n and T are pressure, volume, the amount of substance and thermodynamic temperature of the gas in the container respectively; $V_w$ and $n_j$ are the volume of the liquid and the amount of substance of the gas dissolved in the liquid in the equilibrium state; $P_1$ is the steady-state gas pressure in the container at the previous moment; $P_2$ is the gas pressure in the container during exhausting or inflating process; $P_3$ is the steady-state gas pressure in the container to be estimated; with regard to the OCV model, the valve is opened at time $t_1$ to exhaust or inflate with the gas, the valve is closed at time $t_2$, $t_2=t_1+\Delta t$, $\Delta t \to 0$, and an equilibrium state is reached at time $t_3$ after a long period of time, and the corresponding physical quantities of the model are marked with corresponding numbers at corresponding time.

At time $t_1^-$,
the ideal gas state equation is $$P_1 V = n_1 R T_1 \quad \text{Equation (1)}$$

Solubility equation for gas gap filling is:

$$n_{j1} = \frac{P_1 \phi_m V_w}{R T_1 + b_m P_1} \quad \text{Equation (2)}$$

Wherein. $T_1$: steady-state gas temperature in the container, $P_1$: gas pressure; $n_1$: amount of substance of gas; V: gas volume; R: thermodynamic constant; $\Phi_m$: effective gap constant; $b_m$: Van der waals volume of gas molecules; $V_w$: liquid volume; $n_{j1}$: amount of substance of gas dissolved in the liquid; $t_1^-$: left limit of time $t_1$.

At time $t_2^-$,
the ideal gas state equation is $$P_2 V = n_2 R T_2 \quad \text{Equation (3)}$$

Wherein, $T_2$: gas temperature in the container during the exhausting or inflating process; $P_2$: gas pressure; $n_2$: amount of substance of gas; $t_2^-$: left limit of time $t_2$.

At time $t_3$,
the ideal gas state equation is $$P_3 V = n_3 R T_2 \quad \text{Equation (4)}$$

$$n_3 = n_2 + n_{j1} - n_{j3} \quad \text{Equation (5)}$$

Solubility equation for gas gap filling is:

$$n_{j3} = \frac{P_3 \phi_m V_w}{RT_2 + b_m P_3} \quad \text{Equation (6)}$$

Wherein, $P_3$: gas pressure in the container under steady state to be estimated; $n_3$: amount of substance of gas; $n_{j3}$: amount of substance of gas dissolved in the liquid.

$P_s$ is assumed to be the pressure change from unsteady state to steady state of gas in the system from time $t_2$ to time $t_3$.

$$P_s = P_3 - P_2 \quad \text{Equation (7)}$$

Equations 1-6 are combined into Equation 7 to obtain the simplified Equation.

$$P_s = P_3 - P_2 = \frac{R^2 T_2 \phi_m V_w}{V b_m^2} \times \left( \frac{T_2}{\frac{RT_2}{b_m} + P_3} - \frac{T_1}{\frac{RT_1}{b_m} + P_1} \right) \quad \text{Equation (8)}$$

Assuming:

$$k_1 = \frac{R^2 \phi_m V_w}{V b_m^2}, \quad k_2 = \frac{R}{b_m} \quad \text{Equation (9)}$$

Parameters $k_1$, $k_2$ are put back into Equation 8 again:

$$P_3 - P_2 = \frac{k_1 T_2}{k_2 T_2 + P_3} - \frac{k_1 T_1}{k_2 T_1 + P_1} \quad \text{Equation (10)}$$

All the parameters of Equation 10 have physical meaning, i.e. the values of all parameters are greater than 0 and the system pressure of the model is greater than 0, then the denominator is greater than 0, and Equation 10 is rewritten as Equation 11:

$$P_3^2 + P_3 \times \left( T_2 k_2 - P_2 + \frac{T_1 k_1}{T_1 k_2 + P_1} \right) + \left( \frac{T_1 k_1 T_2 k_2}{T_1 k_2 + P_1} - P_2 T_2 k_2 - k_1 T_2 \right) = 0 \quad \text{Equation (11)}$$

Considering $P_3$ as a variable, Equation 11 can be seen as a quadratic equation of $P_3$. Assuming:

$$a = 1, \quad b = T_2 k_2 - P_2 + \frac{T_1 k_1}{T_1 k_2 + P_1}, \quad \text{Equation (12)}$$

$$c = \frac{T_1 k_1 T_2 k_2}{T_1 k_2 + P_1} - P_2 T_2 k_2 - T_2 k_1$$

Using $\Delta$ discriminant method and Vieta theorem, we can obtain:

$$\text{as } ac = -\frac{P_1 \times (P_2 k_2 + k_1) + P_2 k_2^2}{k_2 + P_1} < 0$$

is always true, $\Delta = b^2 - 4ac > 0$ is true, thus Equation 11 has and only has one real root, which is.

$$P_3 = \frac{(P_2 - T_2 k_2)(T_1 k_2 + P_1) - T_1 k_1 + \sqrt{(T_1 k_2 + P_1)^2 (T_2 k_2 + P_2)^2 + T_1^2 k_1^2 + 2k_1 (T_1 k_2 + P_1)(T_1 T_2 k_2 + 2 T_2 P_1 - T_1 P_2)}}{2(T_1 k_2 + P_1)} \quad \text{Equation (13)}$$

When the model system is at a time between $t_1$ and $t_2$, it can be listed according to the continuity equation of gas flow:

$$P_2 = P_0 - 1/2 \rho I |I| - 1/2 \mu \rho I \quad \text{Equation (14)}$$

Equation 13 and Equation 14 are the estimation equations for the open circuit voltage OCV wherein the charging current is positive and the discharging current is negative.

Figure 3:
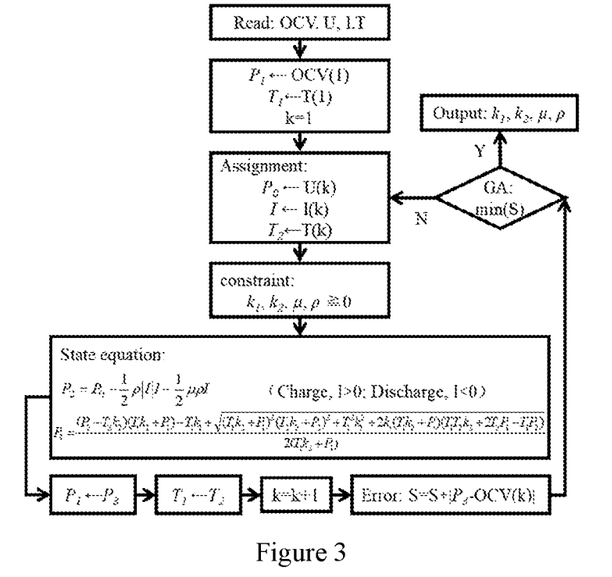
FIG. 3: The flowchart of parameter identification of this invention.

As shown in FIG. 3, identifying the estimation equation parameters according to the experimental data in the step 2 comprises the following specific process:

The open circuit voltages under different currents, terminal voltages and temperatures are obtained by variable-rate, variable-temperature and constant-current HPPC experiments. The values of parameters $k_1$, $k_2$, $\rho$ and $\mu$ are identified by using the genetic algorithm to solve the optimal solution, in order to obtain a complete equation for estimating open circuit voltage.

1. Reading the data of open circuit voltage OCV, terminal voltage U, current I, and temperature T.
2. Assigning initial values to $P_1$ and $T_1$ in equation for estimating open circuit voltage OCV: $P_1 = OCV(1)$, $T_1 = T(1)$, $k = 1$.
3. Assigning: $P_0 = U(k)$, $I = I(k)$, $T_2 = T(k)$.
4. Assuming the parameters to be identified $k_1$, $k_2$, $\rho$ and $\mu$ to be greater than or equal to 0.
5. Putting into the equation for estimating open circuit voltage OCV.
6. Updating the initial values of $P_1$, $T_1$ and k: $P_1 = P_3$, $T_1 = T_2$, $k = k+1$.
7. Using an estimation total error $S = S + |P_3 - OCV(k)|$ as the objective function.
8. Using genetic algorithm to solve an optimal method to determine the termination condition.
9. Repeating the above steps 3 to 8 until the end of parameter identification, and outputting the optimal values of parameters $k_1$, $k_2$, $\rho$ and $\mu$.

Wherein, the identification method includes intelligent algorithm, such as genetic algorithm, particle swarm algorithm, simulated annealing algorithm, ant colony algorithm, support vector machine method, neural network algorithm or least square method. In this example, the genetic algorithm is preferred.

Figure 4:
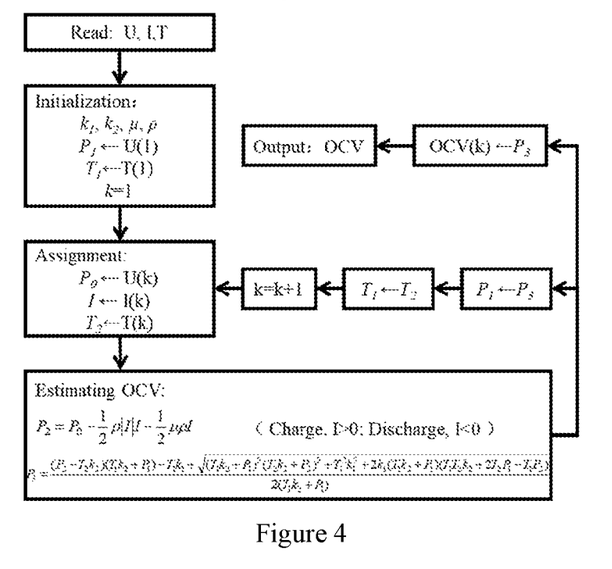
FIG. 4: The flowchart of open circuit voltage estimation algorithm of this invention.

As shown in FIG. 4, designing the method for estimating the open circuit voltage with temperature input according to the identified parameter equations in the step 3 comprises the following specific process:

According to steps 1 and 2, a method for estimating open circuit voltage is designed, and the estimation effect of the method for estimating open circuit voltage is verified;

1. In the OCV estimation equation, assigning $P_1$ with the initial value U(1) and $T_1$ with the initial value T(1), i.e. $P_1=U(1)$, $T_1=T(1)$;
2. Assigning the parameter values identified by the genetic algorithm in step 2 to $k_1$, $k_2$, $\rho$ and $\mu$.
3. Assigning the collected data of terminal voltage, current and temperature to $P_0$, I and $T_2$.
4. Putting into the equation for estimating open circuit voltage, i.e. Equations 13 and 14, to calculate the current open circuit voltage $P_3$.
5. Using the calculated current open circuit voltage $P_3$ to update $P_1$ and using $T_2$ to update $T_1$, i.e. $P_1=P_3$ $T_1=T_2$;
6. Repeating the above steps 3 to 5 until the estimation of open circuit voltage is finished.

The method for estimating the open-circuit voltage of a lithium ion battery with temperature input includes online or offline estimation of parameters of the OCV estimation algorithm.

Figure 5:
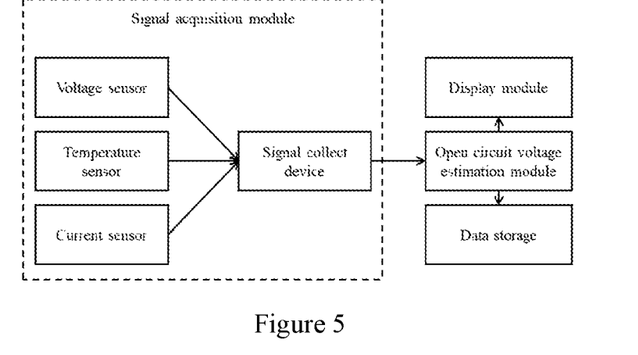
FIG. 5: System Block Diagram of this invention.

As shown in FIG. 5, a system for realizing the method for estimating open circuit voltage of batteries according to the gas-liquid dynamic model comprises a signal acquisition module, an estimation module for open circuit voltage and a display module; the signal acquisition module is configured to acquire current, temperature and voltage of the battery; the signal acquisition module is connected with the estimation module for open circuit voltage and transmits the acquired signals of current, temperature and voltage to the estimation module for open circuit voltage. The estimation module for open circuit voltage calculates values of open circuit voltage according to the equation for estimation open circuit voltage; the estimation module for open circuit voltage is connected to the display module, and transmits values of the current, the temperature, the voltage and the open circuit voltage of battery to the display module for display.

The signal acquisition module includes a current sensor, a temperature sensor and an voltage sensor.

The estimation module for open circuit voltage comprises a single chip microcomputer, which is preferably STM32. The battery OCV estimation method based on the gas-liquid dynamic model is realized on the hardware, and the code written in C language on the Keil uVision5 development platform can be realized on the STM32 single-chip microcomputer.

The estimation module for open circuit voltage is as follows:

First, the STM32 MCU library function file is loaded, the library function is used to configure the STM32 MCU register, and write the clock function, timer function, delay function, storage function, data check function, OCV estimation function and main function, etc.;

1. The current sensor and the temperature sensor are connected to a signal acquisition card, which can directly acquire the voltage of the single battery. Preferably, the voltage of the single battery is in range of 0-5 V;
2. The acquisition card is connected to the serial port of the STM MCU, and the communication mode is selected as RS-232 to transmit the current, voltage and temperature signals of the battery to the single chip microcomputer, 3. The main function of STM32 MCU reads the signals of current, voltage and temperature of the battery, and invokes the OCV estimation function to calculate the value of open circuit voltage under the current input; the current, voltage, temperature and the calculated value of open circuit voltage of battery are written into the memory card, and then are transmitted to the display module of the host computer for display;
4. The steps 1-3 are repeated to realize real-time estimation of open circuit voltage of the battery pack.

The host computer is developed based on the Microsoft Visual Studio platform and is used to display terminal voltage and the open circuit voltage of the battery pack, the open circuit voltage and the fitting minimum open circuit voltage of all series connected battery cells;

The single chip microcomputer comprises a $2^n$-bit single chip microcomputer (n=1, 2, 3 . . . ), and various arithmetic units of ARM cores;

The signal communication protocols used include RS-485, CAN, TCP, modbus, MPI, serial port communication and so on.

Figure 6:
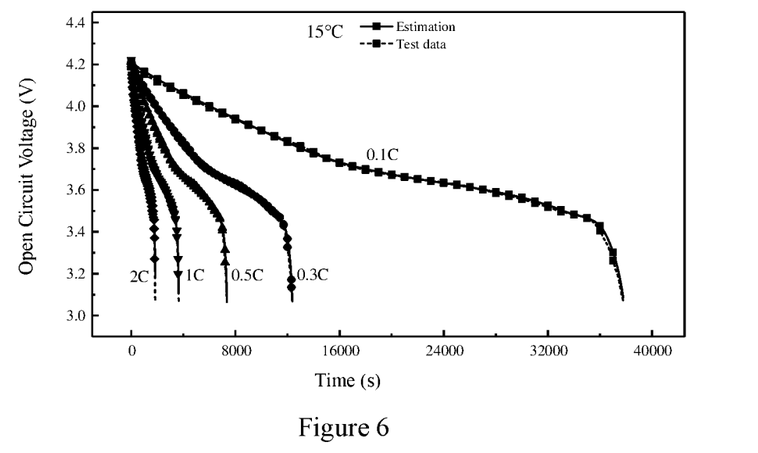
FIG. 6: Estimation results at 15° C.
Figure 7:
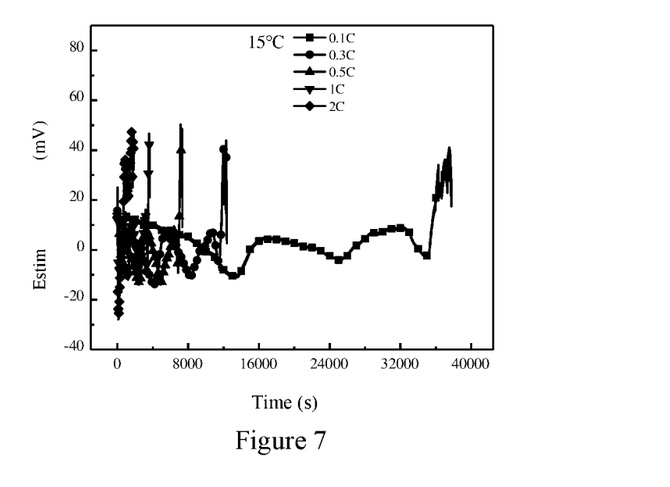
FIG. 7: Estimation errors at 15° C.
Figure 8:
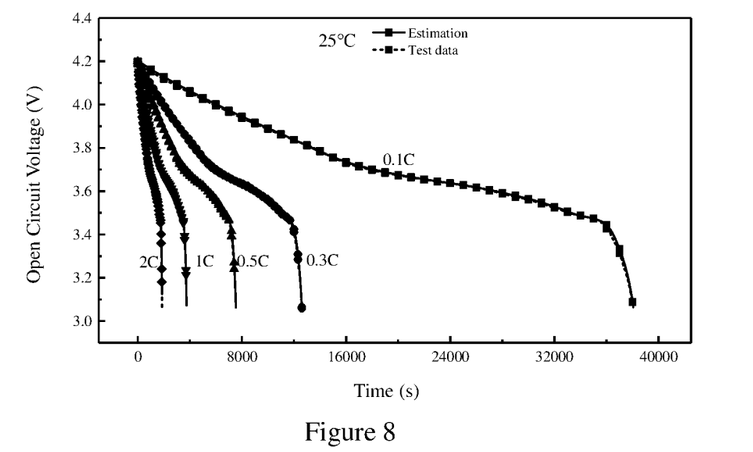
FIG. 8: Estimation results at 25° C.
Figure 9:
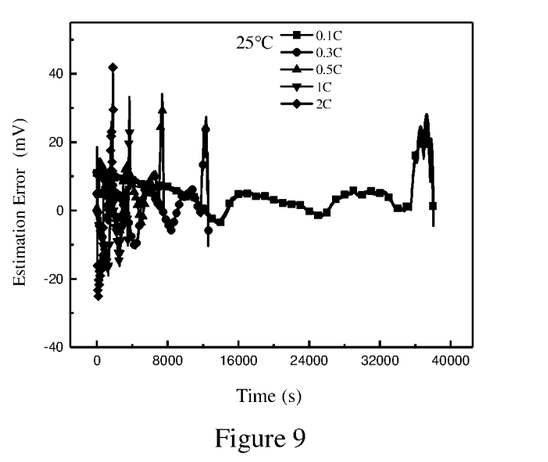
FIG. 9: Estimation errors at 25° C.
Figure 10:
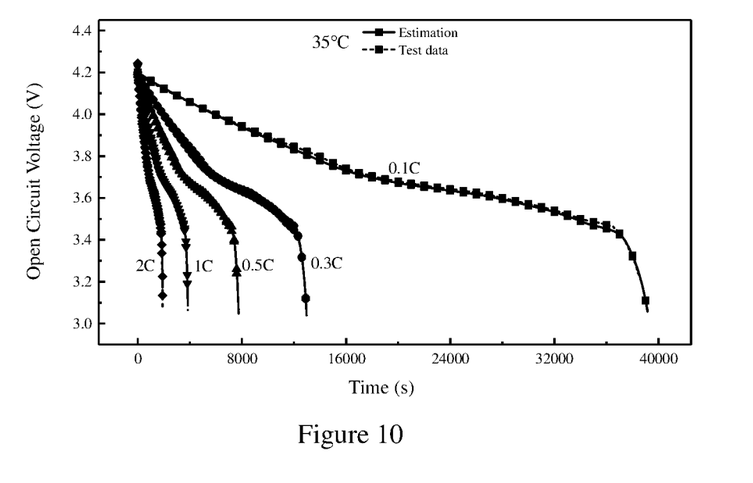
FIG. 10: Estimation results at 35° C.
Figure 11:
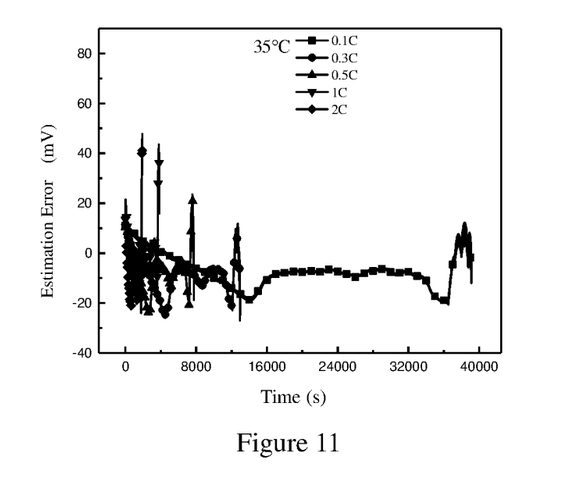
FIG. 11: Estimation errors at 35° C.
Figure 12:
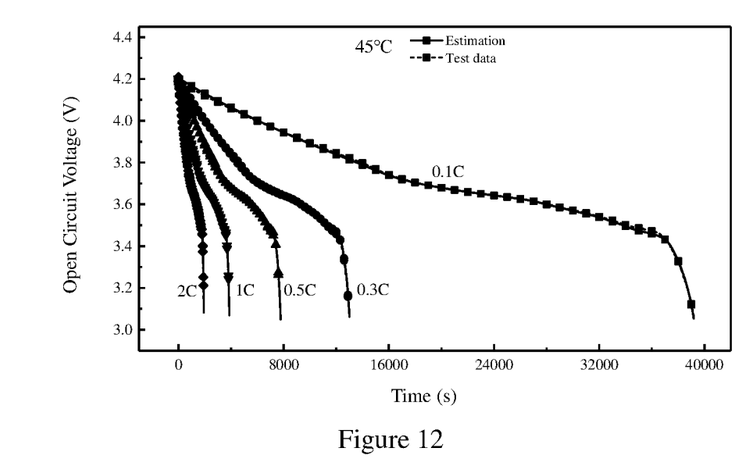
FIG. 12: Estimation results at 45° C.
Figure 13:
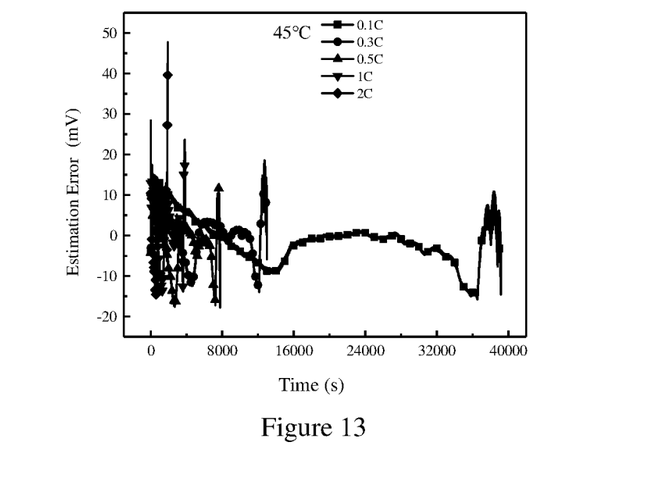
FIG. 13: Estimation errors at 45° C.

The normal operating temperature of the electric vehicle battery is 15° C. to 45° C. The present invention selects 15° C. as the starting temperature, and the estimation results are verified at rates of 0.1 C, 0.3 C, 0.5 C, 1 C and 2 C at intervals of 10° C., as shown in FIGS. 6-13. FIG. 6 shows the estimation effect of the model under 15° C., and shows that the estimation curve and the experimental curve basically coincide; FIG. 7 shows the estimation error corresponding to FIG. 6, and shows that the estimation errors at each rate after equilibrium are within ±20 mV expect at the end of time, so the needs of real vehicle application can be met; FIG. 8 shows the estimation effect of the model under 25° C., and shows that the estimation curve and the experimental curve basically coincide; FIG. 9 shows the estimation error corresponding to FIG. 8, and shows that the estimation errors at each rate after equilibrium are within ±20 mV expect at the end of time, so the needs of real vehicle application can be met; FIG. 10 shows the estimation effect of the model under 35° C., and shows that the estimation curve and the experimental curve basically coincide; FIG. 11 is the estimation error corresponding to FIG. 10, and shows that the estimation errors at each rate after equilibrium are within ±20 mV expect at the end of the time, so the needs of real vehicle application can be met; FIG. 12 is the estimation effect of the model under 45° C., and shows that the estimation curve and the experimental curve basically coincide; FIG. 13 is the estimation error corresponding to FIG. 12, and shows that the estimation errors at each rate after equilibrium are within ±20 mV expect at the end of the time, so the needs of real vehicle application can be met;

It can be seen that the gas-liquid dynamics model with temperature input of the present invention reflects more temperature information of the battery, and the battery temperature improves the robustness of the model by iteration. The equation for estimating the open circuit voltage in the present invention is an analytical expression and decoupled from time with less calculation amount. The equation can gradually eliminate the initial error of the model by iteration, and improve the estimation precision. The temperature as well as the terminal voltage and current are used as the input of the OCV estimation equation. It is not necessary to introduce the temperature compensation coefficient or the empirical equation, the difficulty of parameter identification can be reduced and the scope of application of the model can be extended.

It should be understood that, although the description is described in terms of various examples, each example should not be deemed as including only one independent technical solution. The expression mode of the description is only for the purpose of clarity, and the person skilled in the art should take the description as a whole. The technical solutions in the respective examples may be appropriately combined to form other embodiments which can be understood by the person skilled in the art.

The series of the above detailed descriptions are merely specific descriptions of some possible embodiments of the present invention, and are not intended to limit the protection scope of the present invention. Any equivalent example or modification made without departing from the spirit of the invention should be deemed as falling in the protection scope of the present invention.

The invention claimed is:

1. A method for estimating open circuit voltage of lithium ion battery with temperature input, characterized in that, it comprises the following steps:

step 1: deriving an undetermined equation for estimating the open circuit voltage with temperature input according to a gas-liquid dynamic model, and embedding the undetermined equation for estimating the open circuit voltage with temperature input into a single chip microcomputer of an open circuit voltage estimation module, wherein, according to an ideal gas state equation, a gas dissolution equilibrium equation and a Bernoulli equation, the undetermined equation for estimating the open circuit voltage is derived as follows:

$$P_3 = \frac{(P_2 - T_2 k_2)(T_1 k_2 + P_1) - T_1 k_1 + \sqrt{(T_1 k_2 + P_1)^2 (T_2 k_2 + P_2)^2 + T_1^2 k_1^2 + 2 k_1 (T_1 k_2 + P_1)(T_1 T_2 k_2 + 2 T_2 P_1 - T_1 P_2)}}{2(T_1 k_2 + P_1)}$$

wherein, $P_2 = P_0 - \frac{1}{2}\rho I|I| - \frac{1}{2}\mu\rho I$, $P_0$, I and $P_1$ represent an orifice pressure, a gas flow rate and a pressure inside a container under steady state in the gas-liquid dynamic model, respectively, and correspond to a terminal voltage, a current and the open circuit voltage in the battery respectively;

$P_3$ represents a gas pressure in the container under steady state to be estimated in the gas-liquid dynamic model, and represents the open circuit voltage to be estimated in the battery, $P_2$ is a gas pressure in the container during exhausting or inflating process $T_1$ represents a steady-state gas temperature in the container at a previous moment in the gas-liquid dynamic model, and represents a steady-state battery temperature at the previous moment in the battery, $T_2$ represents a temperature of the gas in the container during the exhausting or inflating process in the gas-liquid dynamic model, and represents a battery temperature during a discharging or charging process in the battery, $\rho$ represents a density of gas flow, $\mu$ represents a resistance coefficient of gas flow, $k_1$ represents a first equivalent parameter, and $k_2$ represents a second equivalent parameter;

step 2: identifying and estimating equation parameters according to an experimental test, wherein, open circuit voltages corresponding to different currents, terminal voltages and temperatures are obtained through the experimental test, optimal values of the parameters $k_1$, $k_2$, $\rho$ and $\mu$ in the undetermined equation for estimating the open circuit voltage are identified by identification methods, and then the optimal values of the parameters $k_1$, $k_2$, $\rho$ and $\mu$ are assigned to the undetermined equation for estimating the open circuit voltage in the step 1 to obtain a complete equation for estimating the open circuit voltage;

step 3: acquiring a current signal of the battery with a current sensor in a signal acquisition module, acquiring a temperature signal of the battery with a temperature sensor in the signal acquisition module, acquiring a voltage signal of the battery with a voltage sensor in the signal acquisition module, transmitting the acquired current signal, temperature signal, and voltage signal to the single chip microcomputer, and designing a method for estimating the open circuit voltage with temperature input according to the complete equation for estimating the open circuit voltage; and calculating to obtain an estimated value of the open circuit voltage.

2. The method for estimating open circuit voltage of lithium ion battery with temperature input according to claim 1, characterized in that, the gas-liquid dynamic model is modeled based on a physical prototype which comprises a sealed container provided with a gas-liquid coexistence system, and pipes and valves are installed at the top of the container; there is a certain volume $V_w$ of liquid in the container and a remaining volume V is filled with a gas with a pressure of P, a temperature of T, an amount of substance of n and the density of $\rho$.

3. The method for estimating open circuit voltage of lithium ion battery with temperature input according to claim 2, characterized in that, step 1 comprises the following process:

wherein, in the above gas-liquid dynamic model, $\mu$ is comprehensive resistance coefficient of one of the pipes during gas flow; I and $P_0$ are the gas flow rate and the orifice gas pressure respectively;

P, V, n and T are the pressure, the remaining volume, the amount of substance and the temperature of the gas in the container respectively;

$V_w$ and $n_j$ are a volume of the liquid and an amount of substance of the gas dissolved in the liquid in an equilibrium state;

$P_1$ is the steady-state gas pressure in the container at the previous moment;

$P_2$ is the gas pressure in the container during exhausting or inflating process; and $P_3$ is the steady-state gas pressure in the container to be estimated, with regard to the gas-liquid dynamic model, one of the valves is opened at time $t_1$ to exhaust or inflate with the gas, the valve is closed at time $t_2$, $t_2 = t_1 + \Delta t$, $\Delta t \to 0$, and the equilibrium state is reached at time $t_3$, at time $t_1^-$, the ideal gas state equation is $$P_1 V = n_1 R T_1 \qquad \text{Equation (1)}$$

solubility equation for gas gap filling is:

$$n_{j1} = \frac{P_1 \phi_m V_w}{R T_1 + b_m P_1} \qquad \text{Equation (2)}$$

wherein, $T_1$: steady-state gas temperature in the container;
$P_1$: gas pressure;
$n_1$: amount of substance of gas;
V: gas volume;
R: thermodynamic constant;
$\Phi_m$: effective gap constant;
$b_m$: Van der waals volume of gas molecules;
$V_w$: liquid volume;
$n_{j1}$: amount of substance of gas dissolved in the liquid;
$t_1^-$: left limit of time $t_1$;
at time $t_2^-$, the ideal gas state equation is $$P_2 V = n_2 R T_2 \qquad \text{Equation (3)}$$

wherein, $T_2$: gas temperature in the container during the exhausting or inflating process;
$P_2$: gas pressure;
$n_2$: amount of substance of gas;
$t_2^-$: left limit of time $t_2$;
at time $t_2$, the ideal gas state equation is $$P_3 V = n_3 R T_2 \qquad \text{Equation (4)}$$

$$n_3 = n_2 + n_{j2} - n_{j3} \qquad \text{Equation (5)}$$

solubility equation for gas gap filling is:

$$n_{j3} = \frac{P_3 \phi_m V_w}{R T_2 + b_m P_3} \qquad \text{Equation (6)}$$

wherein, $P_3$: gas pressure in the container under steady state to be estimated;
$n_3$: amount of substance of gas;
$n_{j3}$: amount of substance of gas dissolved in the liquid;
$P_s$ is assumed to be the pressure change from unsteady state to steady state of gas in the system from time $t_2$ to time $t_3$, $$P_s = P_3 - P_2 \qquad \text{Equation (7)}$$

Equations 1-6 are combined into Equation 7 to obtain the simplified Equation;

$$P_s = P_3 - P_2 = \frac{R^2 T_2 \phi_m V_w}{V b_m^2} \times \left( \frac{T_2}{\frac{R T_2}{b_m} + P_3} - \frac{T_1}{\frac{R T_1}{b_m} + P_1} \right) \qquad \text{Equation (8)}$$

assuming:

$$k_1 = \frac{R^2 \phi_m V_w}{V b_m^2}, \; k_2 = \frac{R}{b_m} \qquad \text{Equation (9)}$$

parameters $k_1$, $k_2$, are put back into Equation 8 again:

$$P_3 - P_2 = \frac{k_1 T_2}{k_2 T_2 + P_3} - \frac{k_1 T_1}{k_2 T_1 + P_1} \qquad \text{Equation (10)}$$

all the parameters of Equation 10 have physical meaning the values of all parameters are greater than 0 and a system pressure of the gas-liquid dynamic model is greater than 0, then the denominator is greater than 0, and Equation 10 is rewritten as Equation 11:

$$P_3^2 + P_3 \times \left( T_2 k_2 - P_2 + \frac{T_1 k_1}{T_1 k_2 + P_1} \right) + \left( \frac{T_1 k_1 T_2 k_2}{T_1 k_2 + P_1} - P_2 T_2 k_2 - k_1 T_2 \right) = 0 \qquad \text{Equation (11)}$$

considering $P_3$ as a variable, Equation 11 can be seen as a quadratic equation of $P_3$;
assuming:

$$a = 1, \; b = T_2 k_2 - P_2 + \frac{T_1 k_1}{T_1 k_2 + P_1}, \qquad \text{Equation (12)}$$
$$c = \frac{T_1 k_1 T_2 k_2}{T_1 k_2 + P_1} - P_2 T_2 k_2 - T_2 k_1$$

as $$ac = -\frac{P_1 \times (P_2 k_2 + k_1) + P_2 k_2^2}{k_2 + P_1} < 0$$

is always true, $\Delta = b^2 - 4ac > 0$ is true, thus Equation 11 has and only has one real root, which is:

$$P_3 = \frac{(P_2 - T_2 k_2)(T_1 k_2 + P_1) - T_1 k_1 + \sqrt{(T_1 k_2 + P_1)^2 (T_2 k_2 + P_2)^2 + T_1^2 k_1^2 + 2 k_1 (T_1 k_2 + P_1)(T_1 T_2 k_2 + 2 T_2 P_1 - T_1 P_2)}}{2(T_1 k_2 + P_1)} \qquad \text{Equation (13)}$$

when the gas-liquid dynamic model system is at a time between $t_1$ and $t_2$, it can be listed according to a continuity equation of gas flow:

$$P_2 = P_0 - 2/2 \rho I |I| - 2/2 \mu \rho I \qquad \text{Equation (14)}.$$

4. The method for estimating open circuit voltage of lithium ion battery with temperature input according to claim 1,
characterized in that, identifying and estimating equation parameters in the step 2 comprises the following specific process:
(1) reading data of the open circuit voltage OCV, terminal voltage U, current I, and temperature T;
(2) assigning initial values to $P_1$ and $T_1$ in the undetermined equation for estimating the open circuit voltage: $P_1 = OCV(1)$, $T_1 = T(1)$, $k=1$;
(3) assigning: $P_0 = U(k)$, $I = I(k)$, $T_2 = T(k)$;
(4) assuming the parameters to be identified $k_1$, $k_2$, $\rho$ and $\mu$ to be greater than or equal to 0;
(5) putting into the undetermined equation for estimating the open circuit voltage;
(6) updating the initial values of $P_1$, $T_1$ and k: $P_1 = P_3$, $T_1 = T_2$, $k = k+1$;
(7) using an estimation total error $S = S + |P_3 - OCV(k)|$ as an objective function;
(8) until S no longer becomes smaller, determining a termination condition;

(9) repeating the above steps (3) to (8) until an ending criteria is satisfied, and outputting the optimal values of parameters $k_1$, $k_2$, $\rho$ and $\mu$.

5. The method for estimating open circuit voltage of lithium ion battery with temperature input according to claim 1, characterized in that, step 3 comprises the following process:
   (1) in the undetermined equation for estimating the open circuit voltage, assigning $P_1$ with the initial values $U(1)$ and $T_1$ with initial values $T(1)$: $P_1=U(1)$, $T_1=T(1)$;
   (2) assigning the optimal parameter values identified in step 2 to $k_1$, $k_2$, $\rho$ and $\mu$;
   (3) assigning collected data of terminal voltage, current and temperature to $P_0$, I and $T_2$;
   (4) putting into the undetermined equation for estimating the open circuit voltage to calculate a current open circuit voltage $P_3$;
   (5) using the calculated current open circuit voltage $P_3$ to update $P_1$ and using $T_2$ to update $T_1$: $P_1=P_2$, $T_1=T_2$;
   (6) repeating the steps (3) to (5) until an ending criteria is satisfied.

6. The method for estimating open circuit voltage of lithium ion battery with temperature input according to claim 1, characterized in that, the identification methods include genetic algorithm, particle swarm algorithm, simulated annealing algorithm, ant colony algorithm, support vector machine method, neural network algorithm or least square method.

7. The method for estimating open circuit voltage of lithium ion battery with temperature input according to claim 6, characterized in that, the identification methods comprise genetic algorithm.

8. A system for estimating open circuit voltage of lithium ion batteries with temperature input, comprising:
   a signal acquisition module;
   the open circuit voltage estimation module; and
   a display module;
      the signal acquisition module is configured to acquire current, temperature and voltage of the battery;
      the signal acquisition module comprises a current sensor, a temperature sensor and a voltage sensor; the current sensor is configured to acquire the current of battery, the temperature sensor is configured to acquire temperature of battery and the voltage sensor is configured to acquire the voltage of battery;
      the signal acquisition module is connected to the estimation module for the open circuit voltage, and transmits the acquired signals of current, temperature and voltage to the estimation module for the open circuit voltage; the estimation module for the open circuit voltage designs an estimation method for the open circuit voltage with temperature input according to a complete estimation equation for the open circuit voltage, and calculates an estimated value of the open circuit voltage, and
   the estimation module for the open circuit voltage is connected to the display module, and transmits the values of battery current, temperature, voltage and the open circuit voltage to the display module for display, wherein the estimation module is configured to execute the method of claim 1.

* * * * *